United States Patent
Refai-Ahmed

(10) Patent No.: US 9,496,199 B2
(45) Date of Patent: Nov. 15, 2016

(54) HEAT SPREADER WITH FLEXIBLE TOLERANCE MECHANISM

(71) Applicant: General Electric Company, Schenectady, NY (US)

(72) Inventor: Gamal Refai-Ahmed, Albany, NY (US)

(73) Assignee: General Electric Company, Schenectady, NY (US)

( * ) Notice: Subject to any disclaimer, the term of this patent is extended or adjusted under 35 U.S.C. 154(b) by 59 days.

(21) Appl. No.: 14/093,768

(22) Filed: Dec. 2, 2013

(65) Prior Publication Data

US 2014/0151871 A1    Jun. 5, 2014

Related U.S. Application Data

(60) Provisional application No. 61/733,138, filed on Dec. 4, 2012.

(51) Int. Cl.
| | | |
|---|---|---|
| H01L 23/10 | (2006.01) | |
| H01L 23/34 | (2006.01) | |
| H01L 23/40 | (2006.01) | |
| H01L 23/42 | (2006.01) | |
| H01L 23/16 | (2006.01) | |
| H01L 23/367 | (2006.01) | |

(52) U.S. Cl.
CPC .......... *H01L 23/4006* (2013.01); *H01L 23/42* (2013.01); *H01L 23/16* (2013.01); *H01L 23/3675* (2013.01); *H01L 2924/0002* (2013.01)

(58) Field of Classification Search
CPC .................. H01L 23/4006; H01L 2924/3521; H01L 2023/405; H01L 23/36; H01L 23/367; H01L 2924/351

USPC .................. 257/706, 707; 438/122
See application file for complete search history.

(56) References Cited

U.S. PATENT DOCUMENTS

| | | | | |
|---|---|---|---|---|
| 4,561,011 A | * | 12/1985 | Kohara .................. | H01L 23/367 174/16.3 |
| 5,402,077 A | * | 3/1995 | Agahdel .............. | G01R 1/0483 324/754.2 |
| 5,621,615 A | * | 4/1997 | Dawson .............. | H01L 23/4006 165/80.4 |
| 5,926,371 A | * | 7/1999 | Dolbear .............. | H01L 23/4006 174/138 G |
| 6,011,304 A | * | 1/2000 | Mertol ..................... | H01L 23/04 257/704 |
| 6,049,215 A | * | 4/2000 | Agahdel .............. | G01R 1/0483 324/754.14 |
| 6,362,516 B1 | * | 3/2002 | Waters ................ | H01L 23/4006 174/16.3 |
| 6,963,130 B1 | * | 11/2005 | Djekic ................ | H01L 23/4093 257/706 |

\* cited by examiner

*Primary Examiner* — S. V. Clark
(74) *Attorney, Agent, or Firm* — Ziolkowski Patent Solutions Group, SC; Jean K. Testa

(57) ABSTRACT

A semiconductor device packaging system includes a substrate, a heat spreader, a stiffener attached to the substrate, and at least one die electrically coupled to the substrate and thermally coupled to the heat spreader. The semiconductor device packaging system further includes at least one stud coupled to one of the stiffener and the heat spreader and at least one orifice formed through one of the stiffener and the heat spreader. In addition, the at least one orifice is aligned with the at least one stud.

21 Claims, 4 Drawing Sheets

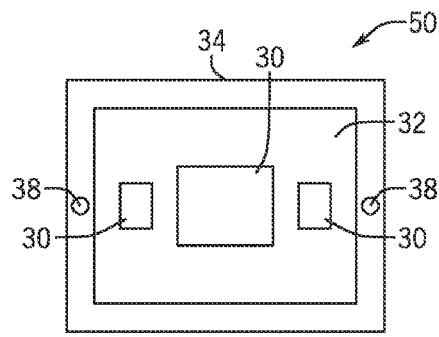
FIG. 7.1
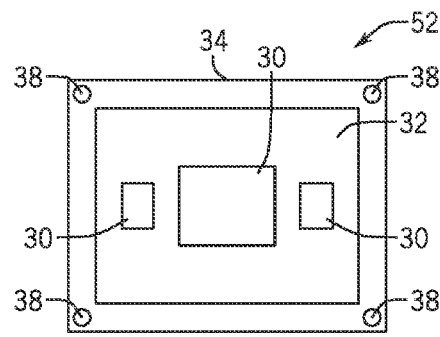
FIG. 7.2
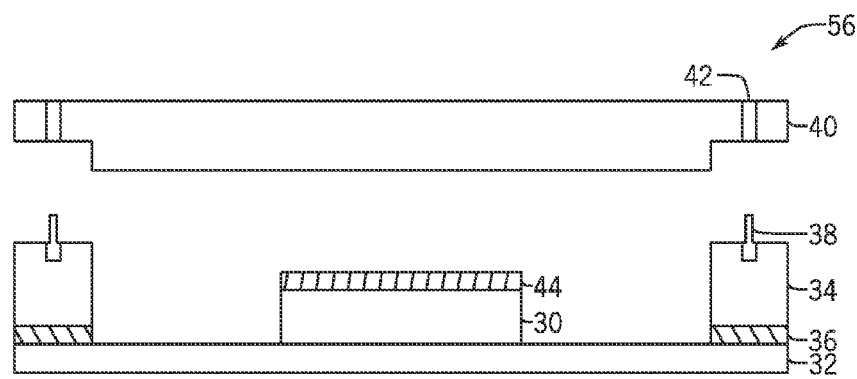
FIG. 8.1
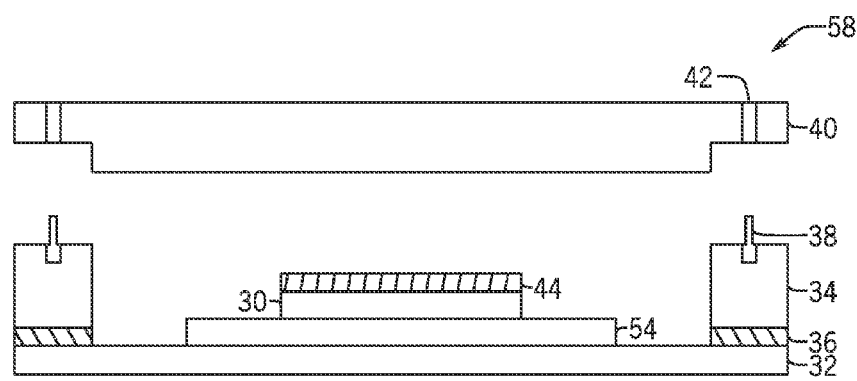
FIG. 8.2

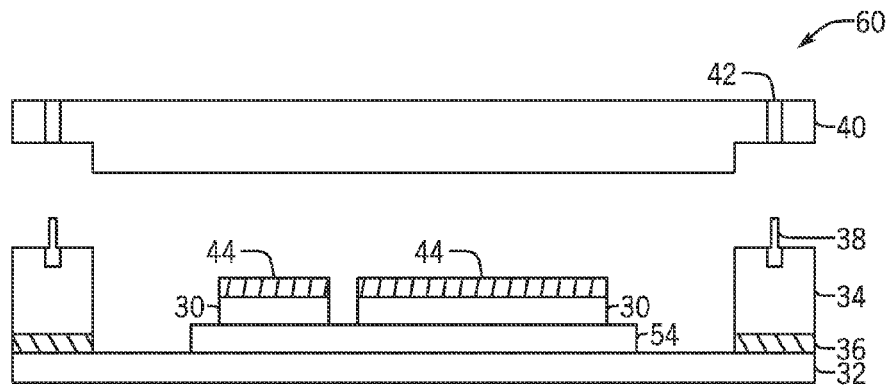
FIG. 8.3
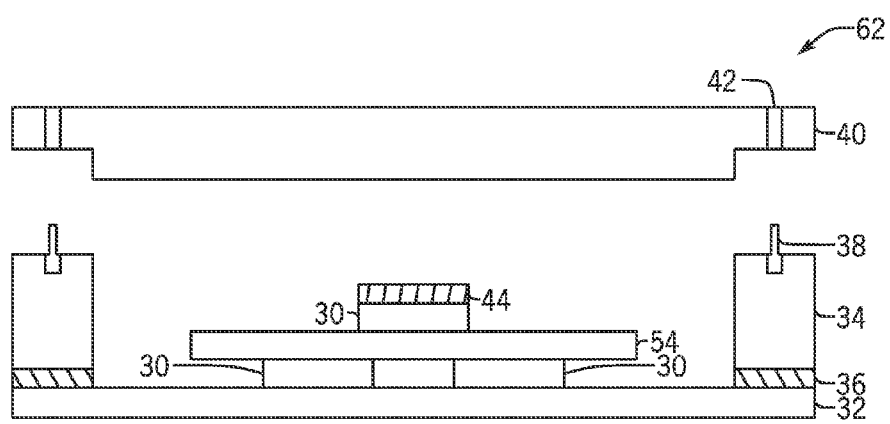
FIG. 8.4
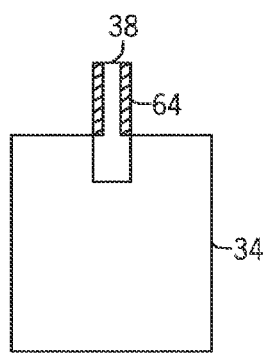
FIG. 9

HEAT SPREADER WITH FLEXIBLE TOLERANCE MECHANISM

CROSS-REFERENCE TO RELATED APPLICATION

The present application is a non-provisional of, and claims priority to, U.S. Provisional Patent Application Ser. No. 61/733,138, filed Dec. 4, 2012, the disclosure of which is incorporated herein by reference.

BACKGROUND OF THE INVENTION

Embodiments of the invention relate generally to a semiconductor device packaging assembly and a method of making the same.

A common practice of packaging semiconductor dies involves mounting a single semiconductor die on a package substrate composed of laminate or organic materials, such as epoxy resins. More recently, experts in the field have introduced multi-die systems. In this practice, at least one or more semiconductor dies are positioned on a single package substrate. In some of these systems, one or more of the semiconductor dies may be high power devices, such as microprocessors, and others may be lower power devices, such as memory and voltage regulator devices.

As a result of having a hybrid package of high power and low power semiconductor dies, the thermal management apparatus of the package may require a thermal management mechanism such as a heat spreader in thermal contact with the semiconductor dies by way of thermal interface material layers. However, the varying thicknesses and tolerances of each component affect the thermal connection of the multi-die system. In addition, another level of tolerances can be introduced due to warping during the assembly process of these components. In turn, these varying dimensions can lead to a low yield from the completed package and manufacturing challenges.

The current state of the art attempts to protect a package, which has an exposed die during the assembly, from warping by introducing a metal ring to act as a stiffener 10, as shown in FIG. 1. FIG. 1 illustrates a semiconductor device package assembly 12 including stiffener 10 attached to a substrate 14 via an adhesive 16. In addition, a die 18 is attached to substrate 14. However, during the assembly process, package assembly 12 can face another level of warping due to the high temperature conditions of processes such as the reflow process. The warping is worse when the assembly introduces multi-die configurations.

FIG. 2 illustrates a semiconductor device package assembly 20 having a heat spreader 22, which is in contact with die 18 through a thermal interface material 24. Heat spreader 22 is further secured to stiffener 10 via adhesive 16. Due to warping during the assembly process and the differing thicknesses of the components, the thermal connection between heat spreader 22 and die 18 may not be appropriately established once heat spreader 22 is secured to stiffener 10, resulting in package assembly 20 having a low yield.

FIG. 3 depicts a semiconductor device package assembly 26 having multiple dies. In these configurations, one or more of the dies 18 may be high power devices, such as microprocessors, and others may be low power devices, such as memory and voltage regulator devices. As a result, the thermal management of assemblies having a hybrid of high power and low power dies 18 may require a thermal management mechanism such as heat spreader 22. Heat spreader 22 is in thermal contact with the semiconductor dies 18 by way of thermal interface material layers 24. Thermal interface material layers 24 can be solder-based, which has certain advantages for high powered devices due to the ability of solder to withstand higher temperatures and the greater thermal conductivity thereof. Thermal interface materials layers 24 may also be an organic material. However, under certain circumstances, the usage of heat spreader 22 with either organic or solder paste thermal interface material layers 24 can lead to additional warping.

As a result, there are many different scenarios during the assembly process of a semiconductor device package assembly that can lead to warping. Warping, in addition to the varying dimensions of multiple components, can lead to a low yield for the completed package. Therefore, it would be desirable to provide a flexible tolerance heat spreader that is able to be secured in a variety of locations along a support stud, as opposed to a single location atop a stiffener. This would allow the heat spreader to adapt its location in order to establish maximum thermal contact between the heat spreader and the components of the package assembly, resulting in being able to maintain the yield of a package even with the addition of multiple dies.

BRIEF DESCRIPTION OF THE INVENTION

In accordance with one aspect of the invention, a semiconductor device packaging system includes a substrate, a heat spreader, a stiffener attached to the substrate, and at least one die electrically coupled to the substrate and thermally coupled to the heat spreader. The semiconductor device packaging system further includes at least one stud coupled to one of the stiffener and the heat spreader and at least one orifice formed through one of the stiffener and the heat spreader. In addition, the at least one orifice is aligned with the at least one stud.

In accordance with another aspect of the invention, a method of assembling a semiconductor device package includes electrically coupling at least one die with a substrate, coupling a stiffener to the substrate, and coupling at least one stud to one of the stiffener and a heat spreader. The method further includes forming at least one orifice through one of the stiffener and the heat spreader, aligning the at least one stud with the at least one orifice to align the heat spreader, the stiffener, and the at least one die, and thermally coupling the heat spreader with the at least one die.

In accordance with yet another aspect of the invention, a flexible tolerance heat spreader for use with a semiconductor device package includes at least one support path formed through the flexible tolerance heat spreader, wherein the at least one support path interacts with at least one stud coupled to a stiffener of the semiconductor device package. In addition, the flexible tolerance heat spreader is variably positioned along a direction of the interaction of the at least one support path and the at least one stud to establish guidance of the flexible tolerance heat spreader to provide thermal contact with at least one die of the substrate.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings:

FIGS. 7.1-7.2 are top perspective views of semiconductor device package assemblies illustrating different locations of support studs in the stiffener, according to embodiments of the invention.

FIGS. 8.1-8.4 are front perspective views of semiconductor device package assemblies illustrating different configurations of one or more dies and an interposer, according to embodiments of the invention.

FIG. 9 is an enlarged view of the support stud of FIG. 4 including a plated layer, according to an embodiment of the invention.

DETAILED DESCRIPTION

Figure 1:
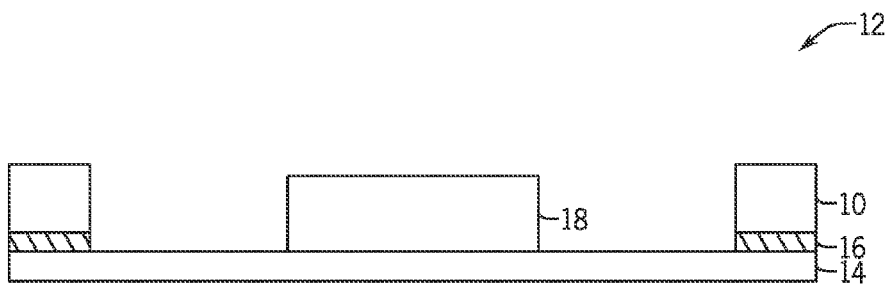
FIG. 1 is a front perspective view of a prior art semiconductor device package assembly.
Figure 2:
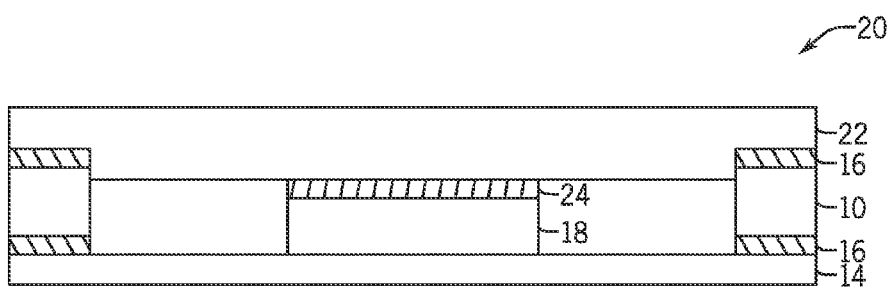
FIG. 2 is a front perspective view of a prior art semiconductor device package assembly including a heat spreader.
Figure 3:
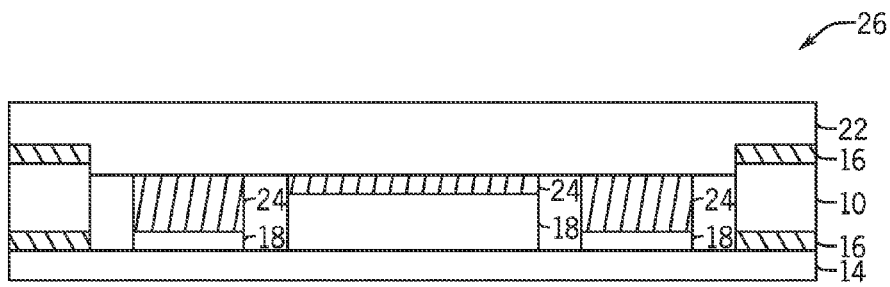
FIG. 3 is a front perspective view of a prior art semiconductor device package assembly including a heat spreader and multiple dies.
Figure 4:
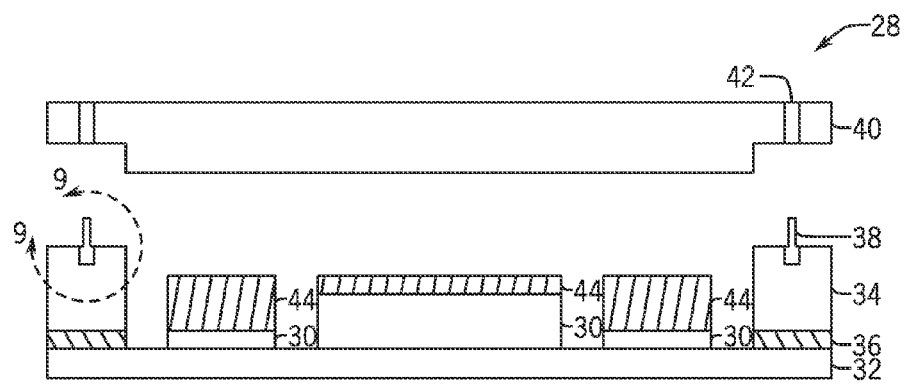
FIG. 4 is a front perspective view of a semiconductor device package assembly, according to an embodiment of the invention.

First referring to FIG. 4, a front perspective view of a semiconductor device packaging assembly 28 according an embodiment of the invention is illustrated. In this embodiment, one or more dies 30 are attached to a substrate 32. It is contemplated that dies 30 can be any combination of high power devices and low power devices. Further, dies 30 may have varying thicknesses. Although FIG. 4 depicts the use of three (3) dies 30, it is contemplated that the semiconductor device package can include more or less than three (3) dies 30 attached to substrate 32. In addition, a stiffener 34 is attached to substrate 32 via an adhesive 36. Stiffener 34 may be a metal ring disposed along the outer perimeter of substrate 32. In this embodiment, two (2) support studs 38 are attached to stiffener 34. While FIG. 4 illustrates the use of two (2) support studs 38, it is contemplated that the semiconductor device package can use more or less than two (2) support studs 38.

The semiconductor device packaging assembly 28 also includes a heat spreader 40. Heat spreader 40 includes orifices or support paths 42 formed through heat spreader 40 and designed to align with support studs 38. Once again, while FIG. 4 illustrates the use of two (2) support paths 42 to coincide with the two (2) support studs 38, it is contemplated that heat spreader 40 may have more or less than two (2) support paths 42 formed therein to coincide with the semiconductor device package having more or less than two (2) support studs 38. A thermal interface material 44 is added to the top portion of each die 30 in order to assist with the thermal connectivity of dies 30 and heat spreader 40 in the completed semiconductor device package.

The interaction between support studs 38 and support paths 42 formed in heat spreader 40 allows for the positioning of heat spreader 40 to be adjusted in the direction of support studs 38. The adjustable positioning of heat spreader 40 and the deforming of thermal interface material 44 allows for thermal contact between heat spreader 40 and each die 30 to be established, even if dies 30 have different thicknesses. As a result, the yield of the package is not sacrificed by the multi-die arrangement.

Figure 5:
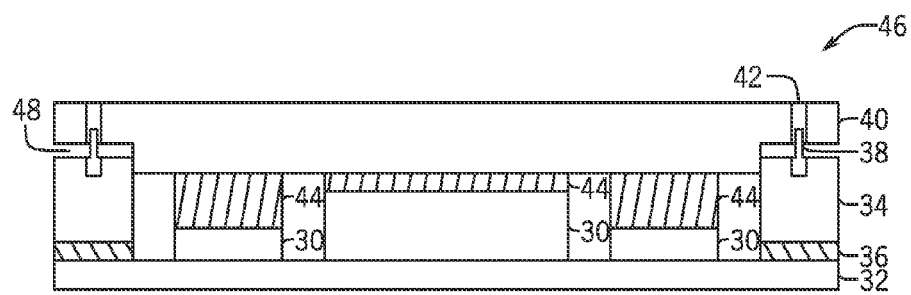
FIG. 5 is a front perspective view of a semiconductor device package assembly using components with greater thicknesses, according to an embodiment of the invention.
Figure 6:
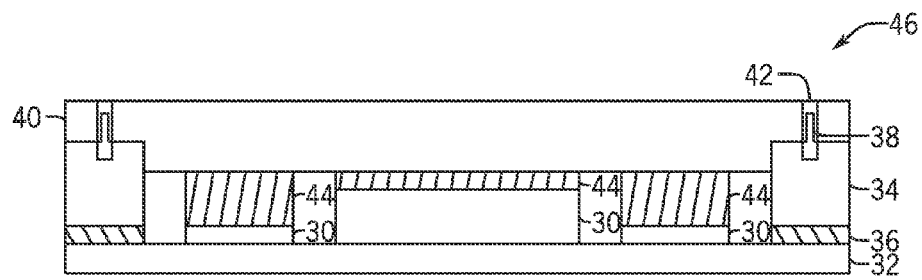
FIG. 6 is a front perspective view of a semiconductor device package assembly using components with smaller thicknesses, according to an embodiment of the invention.

As shown in FIGS. 5 and 6, a semiconductor device package assembly 46 can have varying thicknesses depending on the combination of components within the assembly. FIG. 5 illustrates the use of dies 30 and thermal interface materials 44 having a large combined thickness. In this instance, stiffener 34 and heat spreader 40 are not in direct contact with one another, and an air gap 48 is formed between stiffener 34 and heat spreader 40. The disposition of support studs 38 within support paths 42 keep heat spreader 40 properly aligned while the vertical placement is adjusted to properly fit dies 30 and thermal interface materials 44. The vertical placement of heat spreader 40 reaches its maximum height when support studs 38 are no longer within support paths 42 to keep heat spreader 40 in proper alignment.

FIG. 6 depicts the use of dies 30 and thermal interface materials 44 having a small combined thickness. In this instance, stiffener 34 and heat spreader 40 are in contact with each other. The distance between heat spreader 40 and substrate 32 is at its minimum value when heat spreader 40 and stiffener 34 come in to direct contact with each other, and heat spreader 40 is no longer able to move closer to substrate 32.

The vertical placement of heat spreader 40 is able to be adjusted between the maximum height depicted in FIG. 5 and the minimum height shown in FIG. 6. This flexibility allows heat spreader 40 to accommodate components with varying thickness and tolerances and establish thermal contact with each die 30 used in the semiconductor device packaging assembly 46. As a result, the yield is not sacrificed, even with the addition of multiple components.

FIGS. 7.1-7.2 illustrate different possible configurations of support studs 38 and support paths 42. As shown in FIG. 7.1, one embodiment of the invention has a semiconductor device package assembly 50 containing two (2) support studs 38 coupled to opposing walls of stiffener 34. In this embodiment, heat spreader 40 (not shown) contains two (2) support paths 42 (not shown), mirroring the location of support studs 38, to align heat spreader 40 (not shown) with stiffener 34 and dies 30. FIG. 7.1 shows support studs 38 located on opposite walls of stiffener 34, along a center axis of the semiconductor device package assembly 50. However, it is contemplated that each support stud 38 may be located at any point along the walls of stiffener 34. Further, package assembly 50 may have more or less than two (2) support studs 38 coupled to stiffener 34 at any location along the walls of stiffener 34. Therefore, it is also contemplated that heat spreader 40 (not shown) may contain more or less than two (2) support paths 42 (not shown) to coincide with the number of support studs 38.

FIG. 7.2 illustrates another embodiment of the invention has, wherein a semiconductor device package assembly 52 includes four (4) support studs 38, one support stud 38 in each corner of stiffener 34. In this embodiment, heat spreader 40 (not shown) contains four (4) support paths 42 (not shown), mirroring the location of support studs 38, to properly align heat spreader 40 (not shown) with stiffener 34 and dies 30. While FIG. 7.2 shows the use of four (4) support studs 38, it is contemplated that package assembly 52 may contain more or less than four (4) support studs 38. In addition, it is contemplated that package assembly 52 may also contain more or less than four (4) support paths 42 (not shown), to coincide with the number of support studs 38.

While FIG. 7.1 illustrates support studs 38 located along the walls of stiffener 34 and FIG. 7.2 depicts support studs 38 located in the corners of stiffener 34, it is contemplated that less than all support studs 38 may be located on the walls of stiffener 34 and the remaining support studs 38 may be located in the corners of stiffener 34.

Each of the variations depicted in FIGS. 7.1-7.2 enable heat spreader 40 to accommodate the varying dimensions of the multiple components and ensure alignment of heat spreader 40 with stiffener 34 and dies 30 in the package.

FIGS. 8.1-8.4 illustrate different configurations of one or more dies 30 and the use of an interposer 54. First, FIG. 8.1 depicts a semiconductor device package assembly 56 using one (1) die 30 attached to substrate 32. Die 30 has thermal interface material 44 attached to its top surface to assist with thermal connectivity between die 30 and heat spreader 40. While FIG. 8.1 illustrates using one (1) die 30, it is contemplated that more than one (1) die 30 may be used.

Next, FIG. 8.2 shows a semiconductor device package assembly 58 including interposer 54 disposed between die 30 and substrate 32. Interposer 54 is able to provide power connectivity and signal connectivity between die 30 and substrate 32. One having ordinary skill in the art will recognize that interposer 54 can be made of materials such as silicon, glass, and other materials than can host electrical circuits. Further, it is contemplated that interposer 54 can be a passive circuit or an active integrated circuit, such as a memory device, a radio frequency (RF) analog device, and a micro-electro-mechanical systems (MEMS) device. Thermal interface material 44 is applied to the top surface of die 30 in order to assist with thermal connectivity between die 30 and heat spreader 40.

FIG. 8.3 illustrates a semiconductor device package assembly 60 including interposer 54 disposed between two (2) dies 30 and substrate 32. As previously mentioned, interposer 54 can provide power connectivity and signal connectivity between dies 30 and substrate 32. Interposer 54 is made of a material such as silicon, glass, or other materials able to host electrical circuits. As discussed above, interposer 54 can be a passive circuit or an active integrated circuit, such as a memory device, an RF device, and a MEMS device. The application of thermal interface material 44 to the top surface of each die 30 assists with the thermal connectivity between each die 30 and heat spreader 40. While FIG. 8.3 shows the use of two (2) dies 30, it is contemplated that more or less dies 30 may be used. Further, it is contemplated that additional dies 30 may be connected directly to substrate 32, and not through interposer 54.

Next, FIG. 8.4 depicts a semiconductor device package assembly 62 according to an embodiment of the invention using an alternative stack arrangement. In this embodiment, at least one die 30 is attached to substrate 32. While FIG. 8.4 shows two (2) dies 30 attached to substrate 32, it is contemplated that more or less than two (2) dies 30 may be attached to substrate 32. Interposer 54 is then attached to the top surfaces of dies 30. Package assembly 62 further includes at least one additional die 30 attached to the top surface of interposer 54. Even though FIG. 8.4 illustrates one (1) die 30 attached to the top surface of interposer 54, it is contemplated that more dies 30 may be attached to the top surface of interposer 54. Thermal interface material 44 is also applied to the dies 30 attached to the top surface of interposer 54 to achieve thermal connectivity between dies 30 and heat spreader 40. In this embodiment, interposer 54 can provide power connectivity and signal connectivity between dies 30 located on both sides of interposer 54 and substrate 32. As previously mentioned, interposer 54 is made of a material such as silicon, glass, or other materials able to host electrical circuits. Further, interposer 54 can be a passive circuit or an active integrated circuit, such as a memory device, an RF device, and a MEMS device.

With respect to FIGS. 8.1-8.4, each semiconductor device package assembly 56, 58, 60 also includes attaching stiffener 34 to substrate 32 via adhesive 36. Stiffener 34 also includes at least one support stud 38 attached thereto. While FIGS. 8.1-8.4 all depict two (2) support studs 38, it is contemplated that less or more support studs 38 may be used. Each semiconductor device package assembly 56, 58, 60, 62 further includes heat spreader 40, and heat spreader 40 includes at least one support path 42. Once again, while FIGS. 8.1-8.4 only depict two (2) support paths 42, it is contemplated that one or more support paths 42 may be used. Specifically, the number of support paths 42 coincides with the number of support studs 38. In addition, each support path 42 is aligned with a respective support stud 38. Thermal interface material 44 is also applied to the top portion of each die 30 to achieve thermal connectivity between dies 30 and heat spreader 40, when heat spreader 40 is positioned in its final location.

The interaction between support studs 38 and support paths 42 allows for heat spreader 40 to be adjusted in the direction of support studs 38. The adjustable positioning of heat spreader 40 and the deforming of thermal interface material 44 allows for thermal contact between heat spreader 40 and each die 30, which allows the yield of the package to be sustained even in multi-die arrangements with components having varying thicknesses.

Now referring to FIG. 9, an enlarged view of support stud 38 and stiffener 34 is provided, according to an embodiment of the invention. In this embodiment, support stud 38 includes a plated layer 64. Plated layer 64 is created from either a two phase material or liquid metal material. Further, plated layer 64 allows for bonding between support stud 38 and its respective support path 42. Bonding is accomplished by placing support stud 38 within support path 42 and subjecting the combination to a heating process. Once heat spreader 40 (not shown) is in proper thermal contact with each die 30, bonding secures heat spreader 40 so that thermal contact with each die 30 is maintained.

In an alternative embodiment of the invention, support paths 42 may be formed in stiffener 34, as opposed to heat spreader 40. As a result, support studs 38 would be coupled to heat spreader 40, as opposed to stiffener 34. In this embodiment, the interaction between support studs 38 and support paths 42 allows heat spreader 40 to be adjusted in the direction of support studs 38. The variable positioning of heat spreader 40 and the deforming of thermal interface material 44 allows for thermal contact between heat spreader 40 and each die 30 resulting in sustained yield of the package with the addition of multi-die arrangements.

In summary, using a heat spreader able to adjust its position before being secured in place provides for a semiconductor device assembly package which can be adjusted for a range of thicknesses and tolerances of different devices and components used within the assembly package. This results in a better thermal connection between the heat spreader and the devices of the package, which in turn allows for a package to contain multiple dies without sacrificing the yield of the package.

Therefore, according to one embodiment of the invention, a semiconductor device packaging system includes a substrate, a heat spreader, a stiffener attached to the substrate, and at least one die electrically coupled to the substrate and thermally coupled to the heat spreader. The semiconductor device packaging system further includes at least one stud coupled to one of the stiffener and the heat spreader and at least one orifice formed through one of the stiffener and the heat spreader. In addition, the at least one orifice is aligned with the at least one stud.

According to another aspect of the invention, a method of assembling a semiconductor device package includes electrically coupling at least one die with a substrate, coupling a stiffener to the substrate, and coupling at least one stud to one of the stiffener and a heat spreader. The method further includes forming at least one orifice through one of the stiffener and the heat spreader, aligning the at least one stud with the at least one orifice to align the heat spreader, the stiffener, and the at least one die, and thermally coupling the heat spreader with the at least one die.

According to yet another aspect of the invention, a flexible tolerance heat spreader for use with a semiconductor device package includes at least one support path formed through the flexible tolerance heat spreader, wherein the at least one support path interacts with at least one stud coupled to a stiffener of the semiconductor device package. In addition, the flexible tolerance heat spreader is variably positioned along a direction of the interaction of the at least one support path and the at least one stud to establish guidance of the flexible tolerance heat spreader to provide thermal contact with at least one die of the substrate.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A semiconductor device packaging system comprising:
    a substrate;
    a heat spreader;
    a ring-shaped stiffener attached to the substrate;
    at least one die electrically coupled to the substrate and thermally coupled to the heat spreader;
    at least one stud coupled to one of the ring-shaped stiffener and the heat spreader; and
    at least one orifice formed through one of the ring-shaped stiffener and the heat spreader, the at least one orifice aligned with the at least one stud;
    wherein the ring-shaped stiffener and the heat spreader are in direct contact with each other or have an air gap disposed therebetween.

2. The system of claim 1 further comprising an interposer electrically coupled to the substrate, wherein the interposer is displaced between the substrate and the at least one die.

3. The system of claim 2 wherein the interposer provides power connectivity and signal connectivity between the substrate and the at least one die.

4. The system of claim 2 wherein the interposer is one of a passive circuit device and an active circuit device.

5. The system of claim 1 wherein the at least one stud and the at least one orifice enables alignment of the heat spreader, the ring-shaped stiffener, and the least one die; and
    a thermal interface material is disposed between the at least one die and the heat spreader.

6. The system of claim 5 wherein the thermal interface material is compressed between the at least one die and the heat spreader.

7. The system of claim 1 wherein the at least one stud includes a plated layer, wherein the plated layer establishes a bond between the at least one stud and the heat spreader when subjected to a heating process.

8. The system of claim 7 wherein the plated layer can be one of a two-phase material and a liquid metal material.

9. The system of claim 1 wherein the at least one die is at least one of a high power device and a low power device.

10. The system of claim 1 wherein the at least one die comprises a plurality of dies, wherein at least one of the plurality of dies is a high power device and at least another of the plurality of dies is a low power device.

11. A method of assembling a semiconductor device package comprising:
    electrically coupling at least one die with a substrate;
    coupling a ring-shaped stiffener to the substrate;
    coupling at least one stud to one of the ring-shaped stiffener and a heat spreader;
    forming at least one orifice through one of the ring-shaped stiffener and the heat spreader;
    aligning the at least one stud with the at least one orifice to align the heat spreader, the ring-shaped stiffener, and the at least one die; and
    thermally coupling the heat spreader with the at least one die;
    wherein, in aligning the heat spreader, the ring-shaped stiffener, and the at least one die, the ring-shaped stiffener and the heat spreader are positioned so as to be in direct contact with each other or have an air gap disposed therebetween.

12. The method of claim 11 further comprising inserting an interposer between the at least one die and the substrate.

13. The method of claim 11 further comprising disposing a thermal interface material between the at least one die and the heat spreader.

14. The method of claim 11 further comprising applying a plated layer to the at least one stud.

15. The method of claim 14 further comprising heating the at least one stud, the plated layer, and the orifice to establish a bond between the at least one stud and the at least one orifice.

16. A flexible tolerance heat spreader for use with a semiconductor device package, the flexible tolerance heat spreader comprising:
    at least one support path formed therethrough;
    wherein the at least one support path interacts with at least one stud coupled to a metal ring of the semiconductor device package;
    wherein the flexible tolerance heat spreader is variably positioned along a direction of the interaction of the at least one support path and the at least one stud to establish guidance of the fleixble tolerance heat spreader to provide thermal contact with at least one die of the substrate; and
    wherein the flexible tolerance heat spreader is in direct contact with the metal ring of the semiconductor device package or separated from the metal ring of the semiconductor device package by an air gap disposed therebetween.

17. The flexible tolerance heat spreader of claim 16 wherein a thermal interface material initiates thermal contact between the flexible tolerance heat spreader and the at least one die of the substrate.

18. The flexible tolerance heat spreader of claim 17 wherein the thermal interface material is deformed when the flexible tolerance heat spreader and the at least one die of the substrate are placed in thermal contact.

19. The flexible tolerance heat spreader of claim 16 wherein the at least one stud has a plated layer.

20. The flexible tolerance heat spreader of claim 19 wherein the plated layer of the at least one stud establishes a bond between the at least one stud and the flexible tolerance heat spreader when heated.

21. The flexible tolerance heat spreader of claim 20 wherein the plated layer can be one of a two-phase material and a liquid metal material.

* * * * *